United States Patent
Chen

(10) Patent No.: US 10,673,021 B2
(45) Date of Patent: Jun. 2, 2020

(54) PACKAGE STRUCTURE, FLEXIBLE DISPLAY SCREEN, AND METHOD FOR MANUFACTURING PACKAGE STRUCTURE

(71) Applicant: SHENZHEN ROYOLE TECHNOLOGIES CO. LTD., Shenzhen, Guangdong (CN)

(72) Inventor: Yiming Chen, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 123 days.

(21) Appl. No.: 15/747,275

(22) PCT Filed: Dec. 31, 2015

(86) PCT No.: PCT/CN2015/100162
§ 371 (c)(1),
(2) Date: Jan. 24, 2018

(87) PCT Pub. No.: WO2017/113314
PCT Pub. Date: Jul. 6, 2017

(65) Prior Publication Data
US 2018/0233702 A1 Aug. 16, 2018

(51) Int. Cl.
*H01L 51/52* (2006.01)
*G02F 1/1333* (2006.01)
(Continued)

(52) U.S. Cl.
CPC .... *H01L 51/5256* (2013.01); *G02F 1/133305* (2013.01); *H01L 51/0097* (2013.01);
(Continued)

(58) Field of Classification Search
CPC ............ H01L 51/5256; H01L 51/5253; H01L 51/529; H01L 51/5327; H01L 27/3246;
(Continued)

(56) References Cited

U.S. PATENT DOCUMENTS 9,472,784 B2   10/2016  Sun
2012/0235207 A1  9/2012  Kwack et al.
(Continued)

FOREIGN PATENT DOCUMENTS

CN   102148336 A   8/2011
CN   103299447 A   9/2013
(Continued)

OTHER PUBLICATIONS

International search report dated Sep. 28, 2016 from corresponding application No. PCT/CN2015/100162.
(Continued)

*Primary Examiner* — Angela K Davison
(74) *Attorney, Agent, or Firm* — Hauptman Ham, LLP

(57) ABSTRACT

A package structure, a flexible display screen, and a method for manufacturing the package structure are provided. The package structure is used for packaging and being bonded on a display panel. The package structure includes a first inorganic layer, the first inorganic layer includes a number of first inorganic elements that are discontinuously arranged on the display panel and a number of second inorganic elements each of which is connected between two adjacent first inorganic elements. By providing the second inorganic elements between the discontinuously arranged first inorganic elements, so that the first inorganic elements and the second inorganic elements are arranged alternately and prevent each other from absorbing water/oxygen, thereby improving the water/oxygen barrier performance of the package structure, that is, the package performance of the package structure is improved.

6 Claims, 5 Drawing Sheets

(51) Int. Cl.
H01L 51/00 (2006.01)
H01L 27/32 (2006.01)

(52) U.S. Cl.
CPC .... H01L 51/5253 (2013.01); *G02F 2201/501* (2013.01); *H01L 27/3246* (2013.01); *H01L 51/529* (2013.01); *H01L 2251/303* (2013.01); *H01L 2251/5338* (2013.01)

(58) Field of Classification Search
CPC ....... H01L 2251/303; H01L 2251/5338; G02F 2201/501
See application file for complete search history.

(56) References Cited

U.S. PATENT DOCUMENTS

| | | | |
|---|---|---|---|
| 2014/0138645 | A1 | 5/2014 | Ryu |
| 2014/0374704 | A1* | 12/2014 | Jang .................... H01L 51/0097 257/40 |
| 2015/0102318 | A1 | 4/2015 | Lee |
| 2016/0043347 | A1* | 2/2016 | Sun .................... H01L 51/5259 257/40 |
| 2016/0254489 | A1 | 9/2016 | Sun et al. |

FOREIGN PATENT DOCUMENTS

| | | |
|---|---|---|
| CN | 103633248 | 3/2014 |
| CN | 103715366 | 4/2014 |
| CN | 104269426 | 1/2015 |
| CN | 104269426 A | 1/2015 |
| CN | 104576687 A | 4/2015 |
| CN | 104576959 | 4/2015 |
| EP | 2341759 A | 7/2011 |
| JP | 2003-297549 A | 10/2003 |
| JP | 2011-138776 A | 7/2011 |
| JP | 2013-544012 A | 12/2013 |
| JP | 2014-193605 A | 10/2014 |
| KR | 20100074748 A | 7/2010 |
| KR | 20110079503 A | 7/2011 |
| KR | 20150043791 A | 4/2015 |
| WO | 2011149317 A | 12/2011 |
| WO | 2015089998 A | 6/2015 |

OTHER PUBLICATIONS

Office Action dated Mar. 1, 2019 from corresponding application No. EP 15911940.3.

* cited by examiner

PACKAGE STRUCTURE, FLEXIBLE DISPLAY SCREEN, AND METHOD FOR MANUFACTURING PACKAGE STRUCTURE

RELATED APPLICATIONS

The present application is a National Phase of International Application Number PCT/CN2015/100162, filed Dec. 31, 2015.

TECHNICAL FIELD

The present disclosure relates to the field of flexible display screens, and more particularly relates to a package structure, a flexible display screen, and a method for manufacturing the package structure.

BACKGROUND

At present, with widely use of flexible display screens, most flexible display screen encapsulate an organic electroluminescence layer (OLED) by using a package structure, to prevent the organic electroluminescence layer from absorbing water/oxygen and fail. However, the present package structures have single structures, most of the package structures are made by alternately stacking organic layers and inorganic layers, which leads to the present package structure easily absorbing too much water/oxygen in a humid environment, resulting in detachment of the organic layer and inorganic layer of the package structures, which affects the performance of the package structure.

SUMMARY

The object of the present disclosure is to provide a package structure with a stable structure, a flexible display screen, and a method for manufacturing the package structure.

In order to solve the above problems, the present disclosure provides a package structure, which is configured for packaging and being bonded to a display panel. The package structure includes a first inorganic layer, and the first inorganic layer includes a number of first inorganic elements that are discontinuously arranged on the display panel and a number of second inorganic elements each of which is connected between two adjacent first inorganic elements.

The present disclosure further provides a flexible display screen. The flexible display screen includes a package structure and a display panel. The first inorganic layer includes a number of first inorganic elements that are discontinuously arranged on the display panel and a number of second inorganic elements each of which is connected between two adjacent first inorganic elements.

The present disclosure further provides a method for manufacturing a package structure. The method includes: forming a first inorganic layer, wherein the first inorganic layer includes a number of first inorganic elements that are discontinuously arranged on the display panel and a number of second inorganic elements each of which is connected between two adjacent first inorganic elements.

In the present disclosure, the package structure, the flexible display screen, and the method for manufacturing the package structure stack a first inorganic layer on a display panel, the first inorganic layer includes a number of first inorganic elements that are discontinuously connected to each other and a number of second inorganic elements each of which is connected between two adjacent first inorganic elements. By alternately arranging the second inorganic elements and the first inorganic elements, so that the first inorganic elements and the second inorganic elements can prevent each other from absorbing water/oxygen, and can prevent water/oxygen from diffusing. Therefore, the water/oxygen barrier performance of the package structure is improved, that is, the package performance of the package structure is improved.

BRIEF DESCRIPTION OF THE DRAWINGS

To better illustrate the technical solutions of embodiments of the present disclosure, the following descriptions will briefly illustrate the accompanying drawings described in the embodiments. Obviously, the following described accompanying drawings are some embodiments of the present disclosure. Those skilled in the art can obtain other accompanying drawings according to the described accompanying drawings without creative efforts.

DETAILED DESCRIPTION OF ILLUSTRATED EMBODIMENTS

The technical solutions of embodiments of the present disclosure will be described clearly and completely in combination with the accompanying drawings of the embodiments of the present disclosure.

Figure 1:
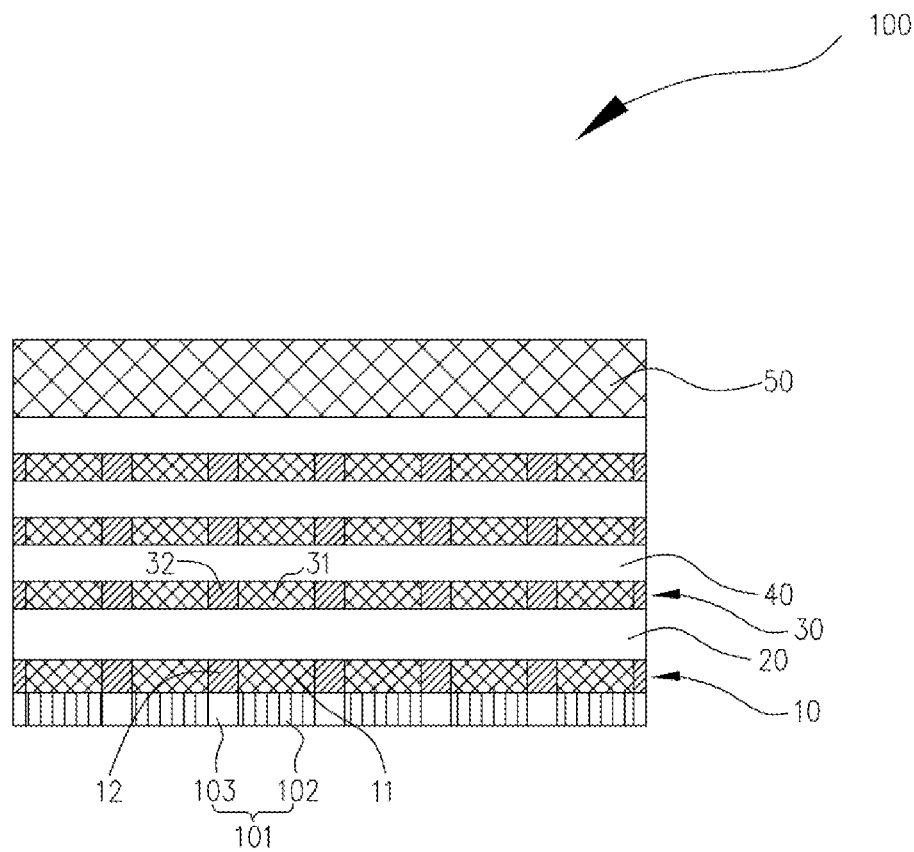
FIG. 1 is a cross-sectional schematic diagram of a package structure provided by the present disclosure.
Figure 2:
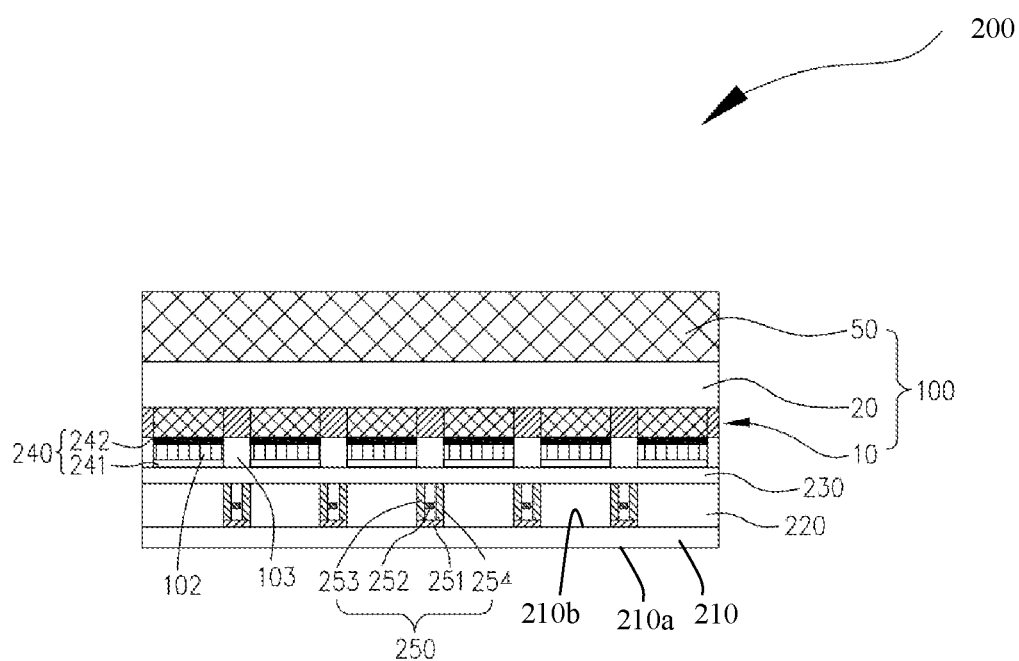
FIG. 2 is a cross-sectional schematic diagram of a flexible display screen provided by the present disclosure.

Referring to FIGS. 1 and 2, the present disclosure provides a package structure 100, which is bonded to a display panel 101. The display panel 101 includes a number of light-emitting units 102 arranged in an array and a number of pixel defining units 103 each of which is connected between two adjacent light-emitting units 102. The package structure 100 includes a first inorganic layer 10. The first inorganic layer 10 includes a number of first inorganic elements 11 and a number of second inorganic elements 12 each of which is connected between two adjacent first inorganic elements 11. The first inorganic elements 11 are arranged in an array. The first inorganic elements 11 are bonded to and cover the light-emitting units 102, and the second inorganic elements 12 are bonded to and cover the pixel defining units 103. It should be understood that, the display panel 101 may be an organic electroluminescence layer (OLED), or a liquid crystal display light-emitting layer (LCD). In the embodiment, taking the display panel 101 as an organic electroluminescence layer, for example. The package structure 100 encapsulates the display panel 101, to prevent the display panel 101 from absorbing water/oxygen, and further to prevent the display panel 101 from display failure.

By stacking a the first inorganic layer 10 on the display panel 101, and the first inorganic layer 10 including a number of first inorganic elements 11 arranged in an array and a number of second inorganic elements 12 each of which is connected between two adjacent first inorganic elements 11, so that the first inorganic elements 11 correspond to the light-emitting units 102. By connecting the second inorganic element 12 between two adjacent first inorganic elements 11, so that the first inorganic elements 11 are discontinuously connected to each other, and the first inorganic elements 11 and the second inorganic elements 12 are arranged alternately. The materials of the first inorganic elements 11 are different from the materials of the second inorganic elements 12, and the first inorganic elements 11 and the second inorganic elements 12 can prevent each other from absorbing water/oxygen, and can prevent water/oxygen from diffusing. Therefore, the water/oxygen barrier performance of the first inorganic layer 10 is improved, that is, the package performance of the package structure is improved.

In the embodiment, the first inorganic elements 11 are arranged in a rectangular array, and the first inorganic elements 11 are arranged along two perpendicular directions. The first inorganic elements 11 are made of inorganic materials, and the first inorganic elements 11 have good water/oxygen barrier performance and light translucent. Moreover, the physical stability and chemical stability of the first inorganic element 11 can effectively protect the display panel 101, cut off water/oxygen erosion, and prevent the display panel 101 from degradation. Each first inorganic element 11 has a rectangular plate shape, and each first inorganic element 11 has a transparent property, so each first inorganic element 11 can transmit the light emitted from the light-emitting unit 102, without affecting the display performance of the display panel 101. Each first inorganic element 11 is independent from each other, which can improve water/oxygen barrier performance.

In the embodiment, the second inorganic elements 12 have a grid shape, and are formed by metal wires that are arranged in a crisscross pattern. The second inorganic elements 12 separate the first inorganic elements 11, and are fixedly connected to the first inorganic elements 11. The second inorganic elements 12 have metal ductility. With waterproof and anti-oxidation properties of metal, the water/oxygen barrier performance of the second inorganic elements 12 can be improved. The second inorganic elements 12 have stable performance, so that the structures between the second inorganic elements 12 and the pixel defining units 103 are stable, thereby making the structures between the first inorganic layer 10 and the display panel 101 be stable. The second inorganic elements 12 are stacked on the pixel defining units 103, and the second inorganic elements 12 and the light-emitting units 102 are staggered, so that the second inorganic elements 12 may have no effect to the display performance of the display panel 101, that is, the good light translucent performance of the package structure can be ensured.

The package structure 100 further includes a first organic layer 20, the first organic layer 20 is bonded to one side of the first inorganic layer 10 which is far away from the display panel 101, and completely covers the first inorganic layer 10. The first organic layer 20 is made of organic materials. In the embodiment, by stacking the first organic layer 20 on the first inorganic layer 10, thereby flattening the first inorganic layer 10, so as to flatten the package structure and improve the service performance of the package structure 100, which facilitates the application of the package structure 100 and the display panel 101 to mobile device. In addition, the first organic layer 20 completely covers the first inorganic layer 10, that is, the first organic layer 20 completely covers the first inorganic elements 11 and the second inorganic elements 12, so as to make the structure of the package structure 100 compact, and further to improve the stability of the package structure 100.

The package structure 100 further includes a second inorganic layer 30 and a second organic layer 40. The second inorganic layer 30 is stacked on one side of the first organic layer 20 which is far away from the first inorganic layer 10. The second inorganic layer 30 includes a number of third inorganic elements 31 and a number of fourth inorganic elements 32 each of which is connected between two adjacent third inorganic elements 31. The third inorganic elements 31 are arranged in an array. Each of the third inorganic elements 31 covers a first inorganic element 11, and each of the fourth inorganic elements 32 covers a second inorganic element 12. The second organic layer 40 is stacked on one side of the second inorganic layer 30 which is far away from the first organic layer 20, and completely covers the second inorganic layer 30.

In the embodiment, the arrangement of the second inorganic layer 30 is the same as the arrangement of the first inorganic layer 10, that is, the materials of the third inorganic elements 31 may be the same as the materials of the first inorganic elements 11, and the materials of the fourth inorganic elements 32 may be the same as the materials of the second inorganic elements 12. By stacking the second inorganic layer 30 on the first organic layer 20, and by further utilizing the bending resistant properties and water/oxygen barrier properties of the second inorganic layer 30, so that the packaging effect of the package structure 100 can be improved. The materials of the second organic layer 40 may be the same as the materials of the first organic layer 20. The second organic layer 40 flattens the second inorganic layer 30, and improves the flatness of the package structure 100, and enhances the structural stability of the package structure 100.

Further, the thickness of the second inorganic layer 30 is less than the thickness of the first inorganic layer 10, so as to effectively reduce the thickness of the package structure 100, so that the package structure 100 can be applied to slim mobile device, which can reduce the thickness of the mobile device, and increase application performance of the package structure 100.

Further, there may be multi-layer second inorganic layers 30 and multi-layer second organic layers 40, and the multi-layer second inorganic layers 30 and the multi-layer second organic layers 40 are alternately stacked.

In the embodiment, a second organic layer 40 is stacked on one side of each of the second inorganic layers 30 which is far away from the first inorganic layer 10 by utilizing the alternately stacked multiple second inorganic layer 30 and multiple second organic layer 40 to increase the water/oxygen barrier channel of the package structure 100, thereby the packaging performance of the package structure 100 can be improved.

The package structure 100 further includes a protective layer 50. The protective layer 50 is bonded to one side of the outermost second organic layer 40 which is far away from the second inorganic layer 30, and completely covers the first inorganic layer 10. In the embodiment, the protective layer 50 is deposited on the second organic layer 40. The protective layer 50 is configured to protect the first inorganic layer 10, the first organic layer 20, the second inorganic layer 30 and the second organic layer 40, and the protective layer 50 has good waterproof and anti-corrosion properties, so as to increase the service life of the package structure 100. The protective layer 50 is further configured to protect the second inorganic elements 12 and the fourth inorganic elements 32 from oxidizing or corrupting, so as to ensure that the package structure 100 has good water/oxygen barrier properties and good bending resistant properties. The protective layer 50 may be formed by thermal evaporation of magnesium fluoride, so that the protective layer 50 may protect the second inorganic elements 12 and the fourth inorganic elements 32. The protective layer 50 may also be formed by chemical vapor deposition, physical vapor deposition, or vacuum evaporation. The protective layer 50 has good anti-corrosion and waterproof properties, so that the protective layer 50 has better protective performance. Further, the materials of the first inorganic element 11 is selected form a group consisting of aluminum oxide, tin oxide, zinc oxide, titanium oxide, zirconium oxide, silicon nitride, silicon oxide nitride, and any combination thereof. The materials of the second inorganic element 12 may be selected form any one metal materials of silver, copper, and aluminum. By utilizing the metal oxide characteristics of the second inorganic element 12, so that the first inorganic element 11 and the second inorganic element 12 may be integrally molded, thereby making the structure between the first inorganic element 11 and the second inorganic element 12 stable. Moreover, the first inorganic element 11 has good flexibility under the good light translucent performance, so as to meet the package requirement of the package structure 100. As the second inorganic elements 12 are made of metal materials, the second inorganic elements 12 have better water/oxygen barrier properties and good bending resistant properties, so as to improve the durability of the package structure 100. As the second inorganic elements 12 are made of materials with high thermal conductivity such as silver, copper, or aluminum, the second inorganic elements 12 can effectively conduct heat for the display panel 101, that is, effectively dissipate the heat generated by the light-emitting unit 102, so as to improve the thermal performance of the package structure, and further meet the multi-functional requirements of the package structure 100.

Further, the materials of the first organic layer 20 is selected form a group consisting of polyethylene terephthalate, polyimide, epoxy, polyethylene, polypropylene, and any combination thereof. The first organic layer 20 is made of organic compound materials, so the first organic layer 20 can be easily molded, and has a stable structure, and the durability is improved. The first organic layer 20 protects the first inorganic layer 10, and blocks the connection channel between the first inorganic element 11 and the second inorganic element 12, to prevent the first inorganic element 11 and the second inorganic element 12 from detaching from each other, and further enhance the stability of the package structure 100. The first organic layer 20 effectively satisfies the slim requirement of the package structure 100, and facilitates the application of the package structure 100 to any device.

The present disclosure further provides a flexible display screen 200. The flexible display screen 200 includes the package structure 100, a flexible back plate 210 and the display panel 101. The display panel 101 is stacked on the flexible back plate 210. The display panel 101 includes a number of light-emitting units 102 and a number of pixel defining units 103 each of which is connected between two adjacent light-emitting units 102, and the light-emitting units 102 are arranged in an array. The package structure 100 is bonded to the display panel 101. The first inorganic elements 11 are bonded to and cover the light-emitting units 102, and the second inorganic elements 12 are bonded to and cover the pixel defining units 103.

In the embodiment, the flexible back plate 210 is a rectangular plate. The flexible back plate 210 may be a thin film transistor (TFT). Driving electrodes are arranged in the flexible back plate 210, to drive the organic electroluminescence layer (OLED), namely the display panel 101 to emit light. The flexible back plate 210 can be bent freely, and includes a first outer surface 210a and a first inner surface 210b that are opposite to each other. The display panel 101 is fixed on the first inner surface 210b. The materials of the flexible back plate 210 is selected from a group consisting of polyethylene naphthalate, polyethylene terephthalate, or polyimide resin.

In the embodiment, the display panel 101 is an OLED (Organic Light-Emitting Diode). Specifically, the light-emitting unit 102 is composed of three primary-colors sub-pixels of RGB, and the pixel defining unit 103 controls the combination of the three primary-colors sub-pixels in the light-emitting unit 102 to emit light, so that the light-emitting units 102 exhibit different colors. The pixel defining unit 103 does not emit light. In another embodiment, the display panel 101 may also be a liquid crystal display light-emitting layer (LCD).

Specifically, the display panel 101 further includes a number of insulating films 220, a passivation layer 230, a number of electrode assemblies 240, and a number of driving assemblies 250. The insulating films 220 and the passivation layer 230 are stacked on the flexible back plate 210 in order. The light-emitting units 102 and the pixel defining units 103 are both stacked on the passivation layer 230. Each electrode assembly 240 is bonded to a light-emitting unit 102, and electrically connected to a pixel defining unit 103, to input electrical signals to the corresponding light-emitting unit 102. Each driving assemblies 250 is embedded in the insulating films 220 and opposite to a pixel defining units 103. The driving component 250 is electrically connected to a electrode assembly 240 and the corresponding pixel defining unit 103 for driving the corresponding light-emitting unit 102 to emit light. The insulating films 220 provide the driving assemblies 250 with an insulating environment, so that the driving assemblies 250 are able to receive electrical signals. The driving assemblies 250 receive the driving electrical signals, and the driving electrode assemblies 240 send voltage changes to the corresponding light-emitting units 102, to drive the corresponding light-emitting units 102 to emit light. The pixel defining unit 103 receives scan electrical signals, to control different RGB sub-pixels in the corresponding light-emitting unit 102 to emit light, such that the corresponding light-emitting unit 102 exhibits a color change.

More specifically, each electrode assembly 240 includes an anode 241 and a cathode 242. The anode 241 is fixed between a corresponding light-emitting unit 102 and the passivation layer 230, and is arranged opposite to the corresponding light-emitting unit 102. The anode 241 is electrically connected to a corresponding driving assembly 250. The cathode 242 is fixed between a corresponding light-emitting unit 102 and the package structure 100, and is arranged opposite to the anode 241. The cathode 242 is electrically connected to a corresponding driving assembly 250. Each driving assembly 250 includes an active wire 251, a gate 252, a source 253 and a drain 254. The active wire 251 is arranged opposite to a corresponding pixel definition unit 103, the source 253 is electrically connected between the active wire 251 and the anode 241, the drain 254 is electrically connected between the cathode 242 and the active wire 251, and the gate 252 is electrically connected to the source 253 and the drain 254. The active wire 251 receives electrical signals and controls the anode 241 and the cathode 242 to apply voltage changes to the corresponding light-emitting unit 102 via the gate 252, the source 253, and the drain 254. As both of the driving component 250 and the pixel defining unit 103 receive the electrical signals, a large amount of heat is easily generated. As neither the pixel defining unit 103 nor the driving component 250 emits light, and by utilizing the second inorganic elements 12 of the package structure 100 to cover the corresponding driving components 250 and the corresponding pixel defining units 103, on one hand, the good thermal conductivity of the second inorganic elements 12 can dissipate the heat generated by the pixel defining unit 103 and the driving assembly 250, on the other hand, the second inorganic elements 12 and the light-emitting unit 102 are staggered, so as to ensure good light transmittance of the package structure 100. Therefore, the flexible display 200 has long service life and excellent performance.

Figure 3:
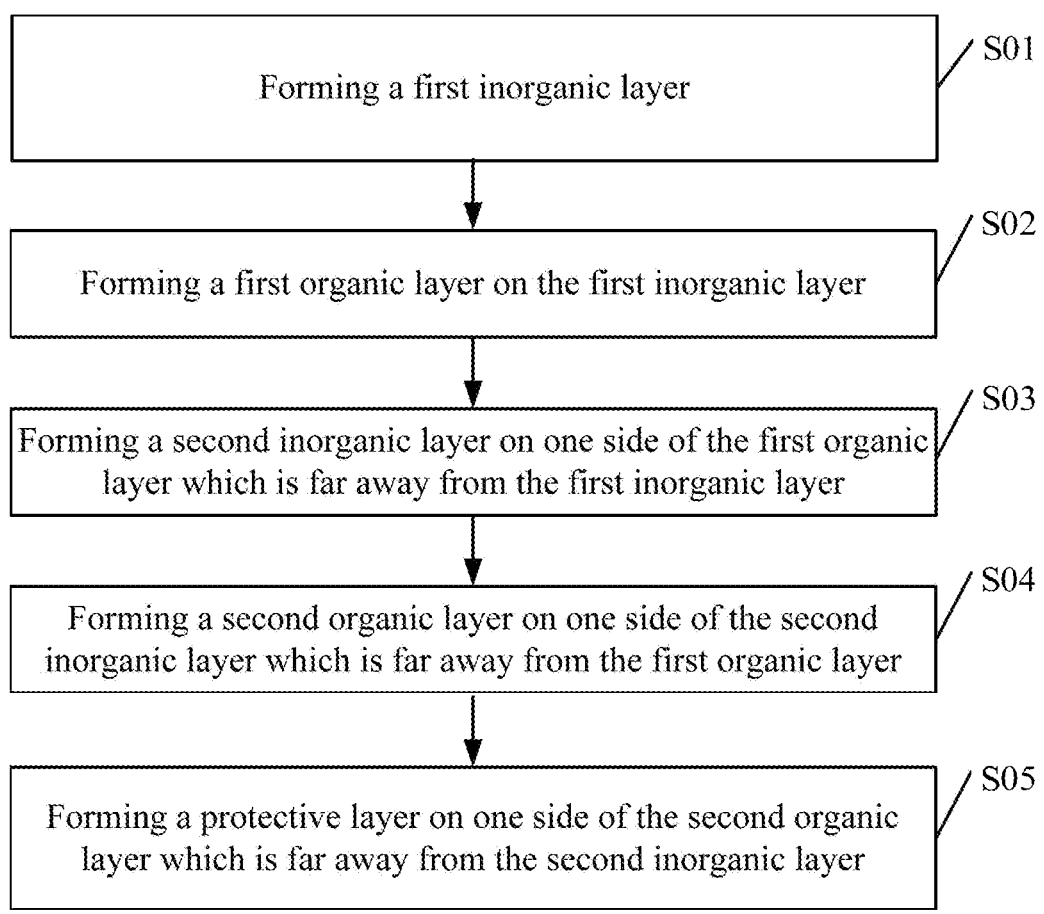
FIG. 3 is a flow chart of a method for manufacturing a package structure provided by the present disclosure.
Figure 4:
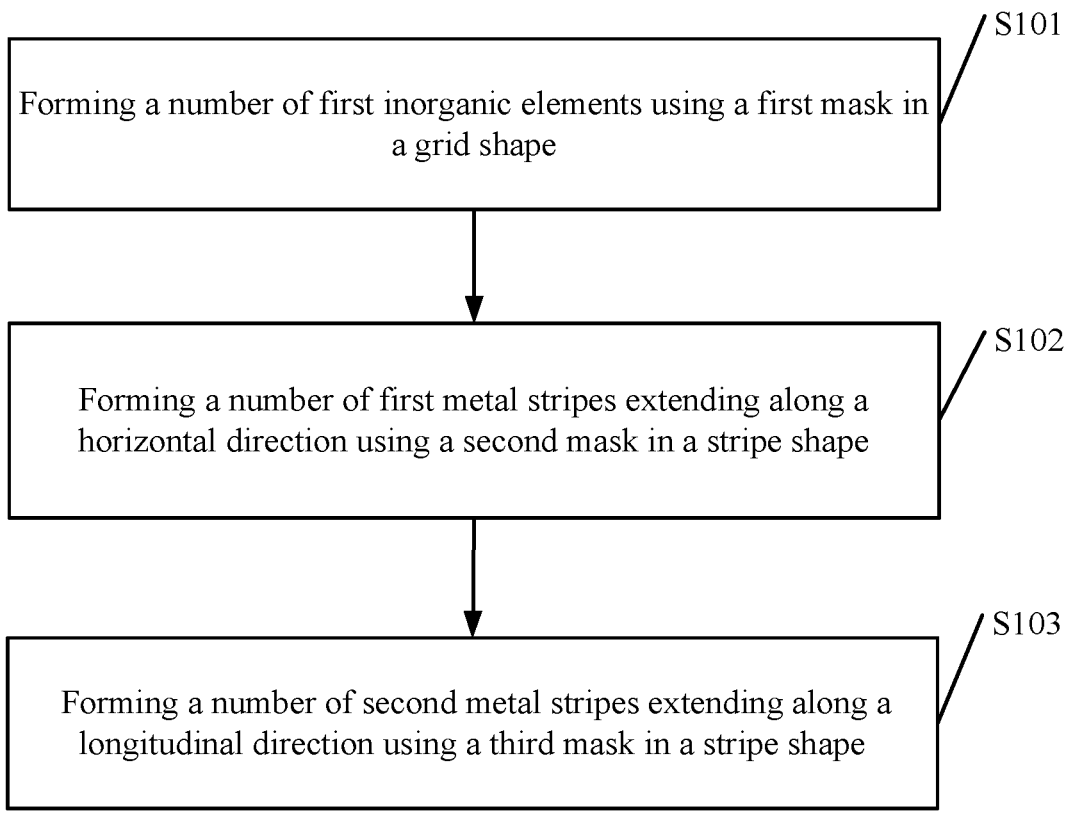
FIG. 4 is a flow chart of a method for forming a first inorganic layer of the package structure manufactured by the method of FIG. 3.
Figure 5:
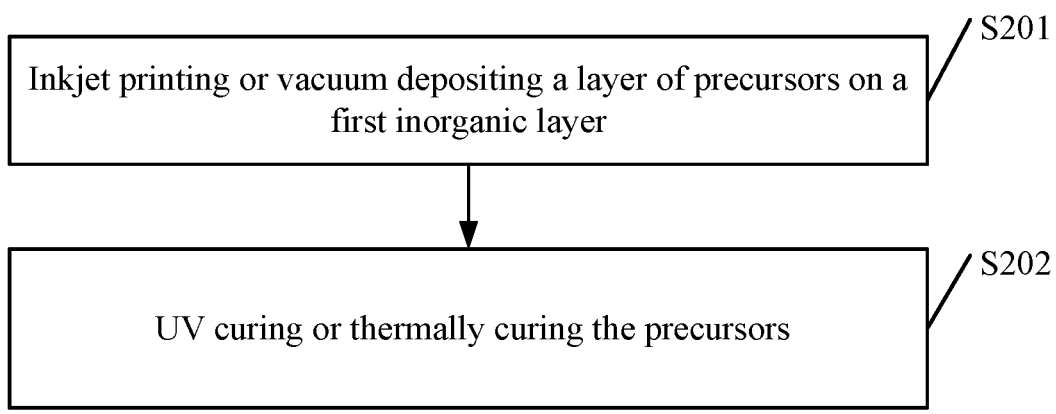
FIG. 5 is a flow chart of a method for forming a first organic layer of the package structure manufactured by the method of FIG. 3.

The present disclosure further provides a method for manufacturing a package structure. The method for manufacturing the package structure provided by the embodiments of the present disclosure will be described in detail below in combination with the accompanying FIGS. 3 to 5. It should be noted that, the method for manufacturing the package structure of FIGS. 3 to 5, is configured to manufacture the structure of the embodiments illustrated in FIGS. 1 and 2 of the present disclosure. For convenience of description, only parts related to the embodiments of the present disclosure are shown. For specific technical details that are not disclosed, reference is made to the embodiments illustrated in FIGS. 1 and 2 of the present disclosure. The method for manufacturing the package structure is configured to manufacture a package structure 100 on a display panel 101, and may include the follows.

S01, a first inorganic layer 10 is formed. The first inorganic layer 10 includes a number of first inorganic elements 11 arranged in an array and a number of second inorganic elements 12 each of which is connected between two adjacent first inorganic elements 11. The first inorganic elements 11 are bonded to the corresponding light-emitting units 102, and the second inorganic elements 12 are bonded to the corresponding pixel defining units 103.

In the embodiment, the first inorganic layer 10 is formed by vapor deposition using a masks, and may specifically include the follows.

S101, a number of first inorganic elements 11 are formed using a first mask 310 in a grid shape.

Figure 6:
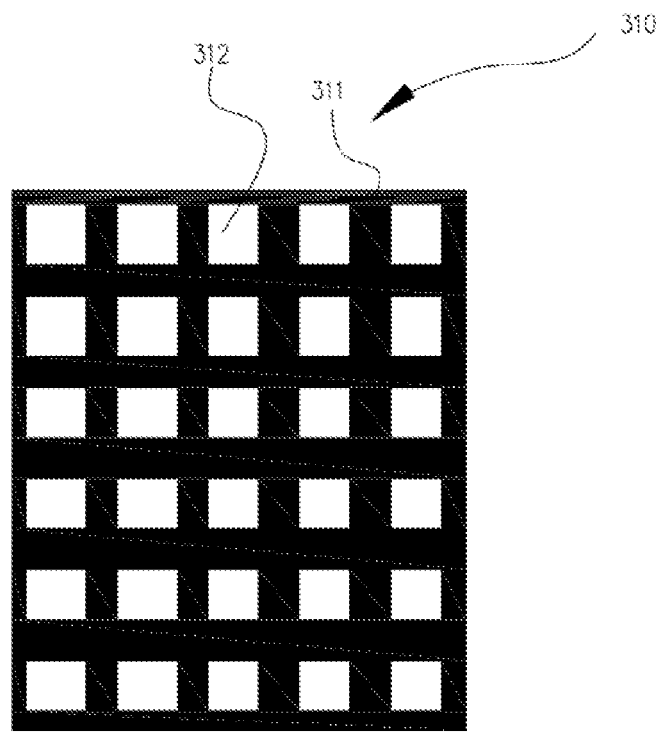
FIG. 6 is a structure diagram of a first mask layer of the package structure manufactured by the method of FIG. 3.
Figure 8:
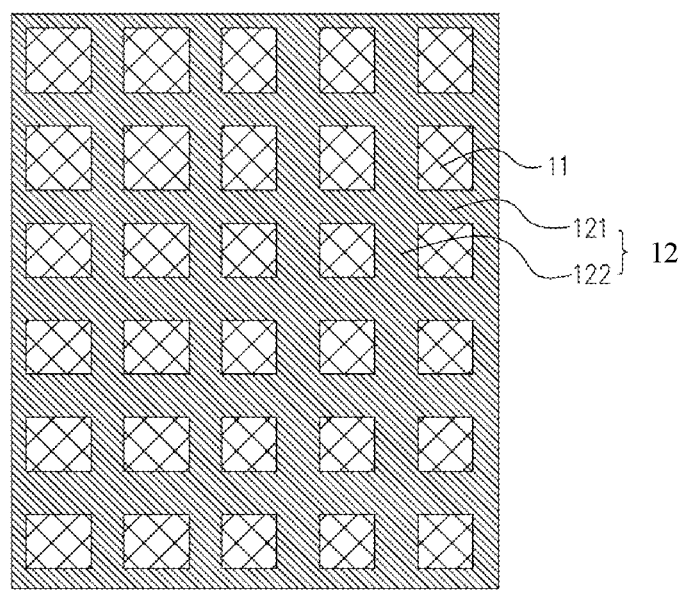
FIG. 8 is a schematic diagram of an arrangement of the first inorganic layer of the package structure manufactured by the method of FIG. 3.

As illustrated in FIGS. 6 and 8, the first mask 310 includes a number of first cover portions 311 in a "#" shape and a number of first hollow regions 312 each of which is arranged among the adjacent first cover portions 311. The first mask 310 is placed on the display panel 101, with the first cover portions 311 covering the corresponding pixel defining units 103, and the first hollow regions 312 overlapping the corresponding light-emitting units 102, then the first inorganic elements 11 are deposited by a vacuum device in the first hollow regions 312, so that the first inorganic elements 10 covers the corresponding light-emitting units 102.

S102, a number of first metal stripes 121 extending along a horizontal direction are formed using a second mask 320 in a stripe shape. Each first metal stripe 121 is arranged between two adjacent first inorganic elements 11 arranged along a longitudinal direction.

Figure 7:
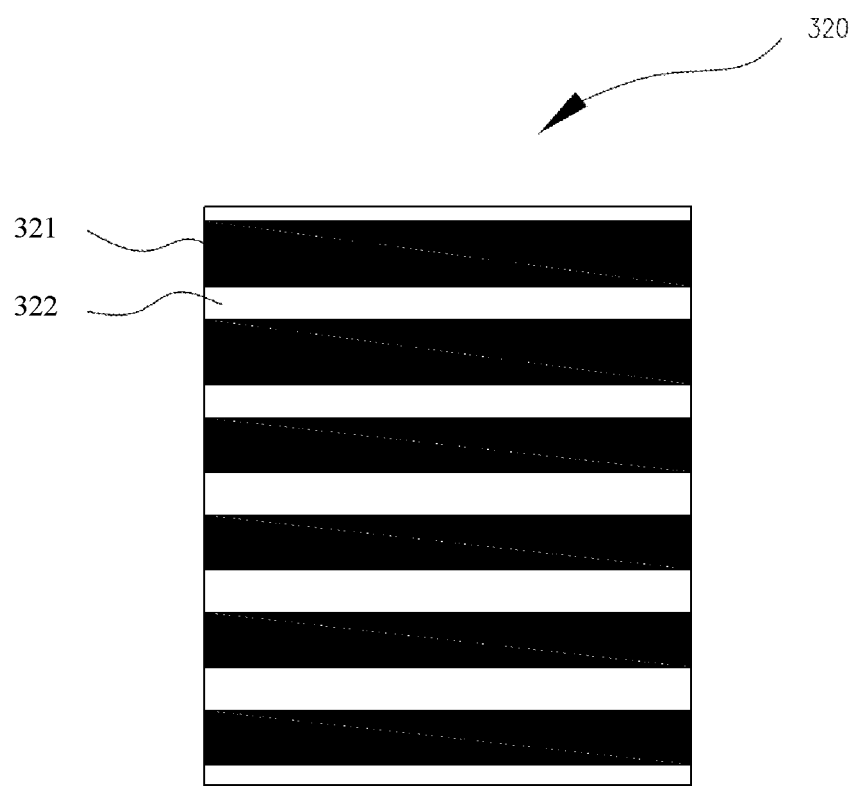
FIG. 7 is a structure diagram of a second mask layer of the package structure manufactured by the method of FIG. 3.

As illustrated in FIGS. 7 and 8, the second mask 320 includes a number of second cover portions 321 extending along the horizontal direction and a number of second hollow regions 322 each of which is arranged between two adjacent second cover portions 321. The second cover portions 321 are arranged side by side along the longitudinal direction, and the second hollow regions 322 are slots extending along the horizontal direction. The first mask 310 is removed from the display panel 101, and the second mask 320 is placed on the display panel 101, with the second cover portions 321 correspondingly covering the first inorganic elements 11 arranged along the horizontal direction, and the second hollow regions 322 overlapping the corresponding pixel defining units 103 arranged along the horizontal direction. Therefore, the first metal stripes 121 are deposited by a deposition device on the pixel defining units 103 arranged along the horizontal direction.

S103, a number of second metal stripes 122 extending along the longitudinal direction are formed using a third mask (not illustrated) in a stripe shape. Each second metal stripe 122 is arranged between two adjacent first inorganic elements 11 arranged along the horizontal direction. The second metal stripes 122 and the first metal stripes 121 constitute the second inorganic elements 12.

The structure of the third mask is the same as the second mask 320, except that the placing direction of the third mask on the display panel 101 is rotated by 90° relative to the second mask 320. Specifically, after the second mask 320 is rotated by 90°, the second covering portions 321 correspondingly covers the first inorganic elements 11 arranged along the longitudinal direction, and the second hollow region 322 overlaps the corresponding pixel defining units 103 arranged along the longitudinal direction. Therefore, the second metal stripes 122 are deposited by the deposition device on the pixel defining units 103 arranged along the longitudinal direction.

S02, a first organic layer 20 is formed on the first inorganic layer 10. The first organic layer is made of organic materials, and completely covers the first inorganic layer 10.

The first organic layer 20 is formed by vacuum evaporation or inkjet printing, and may specifically include the follows.

S201, a layer of precursors (not illustrated) is inkjet printed or vacuum deposited on the first inorganic layer 10.

The precursors may be raw materials of the first organic layer 20. The precursors may be laid on the first inorganic layer 10 to form the first organic layer 20 by physical processing or chemical processing.

S202, the precursors are UV cured or thermally cured to form the first organic layer 20.

The precursors are a light-sensitive materials or a heat-sensitive materials, so that the first organic layer 20 is firmly bonded to the first inorganic layer 10.

S03, a second inorganic layer 30 is formed on one side of the first organic layer 20 which is far away from the first inorganic layer 10. The second inorganic layer 30 includes a number of third inorganic elements 31 arranged in an array and a number of fourth inorganic elements 32 each of which is connected between two adjacent third inorganic elements 31. Each of the third inorganic elements 31 corresponds to a first inorganic element 11, and each of the fourth inorganic elements 32 corresponds to a second inorganic element 12. The specific molding process of the second inorganic layer 30 and the specific molding process of the first inorganic layer 10 may be the same, which will not repeated herein, except that the thickness of the second inorganic layer 30 is less than the thickness of the first inorganic layer 10.

S04, a second organic layer 40 is formed on one side of the second inorganic layer 30 which is far away from the first organic layer 20. The second organic layer 40 completely covers the second inorganic layer 30. The specific molding process of the second organic layer 40 and the specific molding process of the first organic layer 20 may be the same, which will not be repeated herein.

In the embodiment, the processes of step S04 and step S05 are repeated multiple times, and multi-layer second inorganic layers 30 and multi-layer second organic layers 40 alternately stacked are finally formed.

S05, a protective layer 50 is formed on one side of the second organic layer 40 which is far away from the second inorganic layer 30. The protective layer 50 completely covers the first inorganic layer 10.

In the present disclosure, the package structure, the flexible display screen, and the method for manufacturing the package structure stack a first inorganic layer on a display panel, the first inorganic layer includes a number of first inorganic elements that are discontinuously connected to each other and a number of second inorganic elements each of which is connected between two adjacent first inorganic elements. By alternately arranging the second inorganic elements and the first inorganic elements, so that the first inorganic elements and the second inorganic elements can prevent each other from absorbing water/oxygen, and can prevent water/oxygen from diffusing. Therefore, the water/oxygen barrier performance of the package structure is improved, that is, the package performance of the package structure is improved.

The above are the preferred embodiments of the present disclosure. It should be noted that those skilled in the art may still make various improvements and modifications without departing from the principle of the present disclosure, and such improvements and modifications are also considered to be within the scope of the present disclosure.

What is claimed is:

1. A flexible display screen comprising a package structure and a display panel, the package structure comprising: a first inorganic layer stacked on and bonded to the display panel, wherein the first inorganic layer comprises a plurality of first inorganic elements that are discontinuously arranged on the display panel and a plurality of second inorganic elements each of which is connected between adjacent first inorganic elements; and a first organic layer stacked on and bonded to one side of the first inorganic layer which is away from the display panel, the first organic layer completely covers the first inorganic layer, the display panel comprises: a plurality of light-emitting units arranged in an array; a plurality of pixel defining units each of which is connected between adjacent light-emitting units; a plurality of electrode assemblies, wherein each electrode assembly is bonded to a corresponding light-emitting unit, and electrically connected to a corresponding pixel defining unit, to input electrical signals to the corresponding light-emitting unit; wherein each electrode assembly comprises an anode and a cathode, wherein each light-emitting unit is sandwiched between the anode and the cathode of a corresponding electrode assembly; and a plurality of driving assemblies, wherein each of the driving assemblies is opposite to a pixel defining unit, and is electrically connected to an electrode assembly and the corresponding pixel defining unit for driving a corresponding light-emitting unit to emit light; wherein the plurality of first inorganic elements are arranged in an array, and cover the plurality of light-emitting units of the display panel in one-to-one correspondence; the second inorganic elements are bonded to and cover the plurality of pixel defining units of the display panel in one-to-one correspondence, wherein each of the first inorganic elements has a transparent property, and is able to transmit light emitted from a corresponding light-emitting unit; each of the second inorganic elements is made of materials with thermal conductivity, and is configured to dissipate heat generated by a corresponding pixel defining unit; wherein each of the second inorganic elements further covers a corresponding driving assembly and is configured to dissipate heat generated by the corresponding driving assembly.

2. The flexible display screen according to claim 1, wherein the display panel is an organic electroluminescence layer or a liquid crystal display light-emitting layer.

3. The flexible display screen according to claim 1, wherein the package structure further comprises multi-layer second inorganic layers and multi-layer second organic layers, wherein the multi-layer second inorganic layers and multi-layer second organic layers are alternately stacked; the innermost second inorganic layer is stacked on one side of the first organic layer which is away from the first inorganic layer, and completely covers the first inorganic layer; each of the second organic layers is stacked on one side of the second inorganic layer which is away from the first organic layer, and completely covers the second inorganic layer.

4. The flexible display screen according to claim 3, wherein each of the second inorganic layers comprises a plurality of third inorganic elements and a plurality of fourth inorganic elements, each of which is connected between adjacent third inorganic elements, wherein the third inorganic elements are arranged in an array and cover the first inorganic elements in a one-to-one correspondence, and the fourth inorganic elements cover the second inorganic elements in a one-to-one correspondence.

5. The flexible display screen according to claim 4, wherein the first inorganic elements are made of inorganic materials, and the second inorganic elements are made of metal materials.

6. The flexible display screen according to claim 4, wherein the package structure further comprises a protective layer, wherein the protective layer is bonded to one side of the outermost second organic layer which is away from the second inorganic layer, and completely covers the first inorganic layer.

* * * * *